US006956219B2

(12) United States Patent
Saini et al.

(10) Patent No.: US 6,956,219 B2
(45) Date of Patent: Oct. 18, 2005

(54) MEMS BASED CHARGED PARTICLE DEFLECTOR DESIGN

(75) Inventors: Rahul Saini, Dallas, TX (US); Zoran Jandric, Dallas, TX (US); David Tuggle, Portland, OR (US)

(73) Assignee: Zyvex Corporation, Richardson, TX (US)

( * ) Notice: Subject to any disclaimer, the term of this patent is extended or adjusted under 35 U.S.C. 154(b) by 0 days.

(21) Appl. No.: 10/987,871

(22) Filed: Nov. 12, 2004

(65) Prior Publication Data

US 2005/0199822 A1    Sep. 15, 2005

Related U.S. Application Data

(63) Continuation-in-part of application No. 10/799,836, filed on Mar. 12, 2004.

(51) Int. Cl.[7] .............................. G01K 1/08; H01J 3/14; H01J 3/26; H01L 21/44; H05K 1/00
(52) U.S. Cl. .................... 250/398; 438/598; 439/55
(58) Field of Search .................... 206/87; 702/85; 715/837; 438/598, 50, 51; 403/327, 329; 24/625, 453, 455; 250/398

(56) References Cited

U.S. PATENT DOCUMENTS

| | | | |
|---|---|---|---|
| 4,963,748 A | 10/1990 | Szilagyi | |
| 5,122,663 A | 6/1992 | Chang et al. | |
| 5,963,788 A | 10/1999 | Barron et al. | |
| 6,103,399 A | 8/2000 | Smela et al. | |
| 6,219,254 B1 | 4/2001 | Akerling et al. | |
| 6,300,156 B1 | 10/2001 | Decker et al. | |
| 6,396,711 B1 * | 5/2002 | Degani et al. | 361/760 |
| 6,398,280 B1 * | 6/2002 | Parker et al. | 294/86.4 |
| 6,561,725 B1 * | 5/2003 | Ellis et al. | 403/326 |
| 6,672,795 B1 * | 1/2004 | Ellis et al. | 403/327 |
| 6,745,567 B1 | 6/2004 | Mercanzini | |
| 6,762,116 B1 * | 7/2004 | Skidmore | 438/598 |
| 6,881,074 B1 * | 4/2005 | McLenaghan | 439/70 |
| 2002/0125208 A1 | 9/2002 | Christenson et al. | |
| 2004/0135526 A1 * | 7/2004 | Winkler et al. | 315/382 |

OTHER PUBLICATIONS

Muray et al., "Advances in Arrayed Microcolumn Lithography", Journal of Vacuum Science and Technology. B, Microelectronics and Nanometer Structures Processing, Measurement and Phenomena: An Official Publication of the American Vacuum Society, vol. 18 (6), Nov./Dec. 2000, pp. 3099-3104. (IRN10495228).

(Continued)

Primary Examiner—John R. Lee
Assistant Examiner—Johnnie L Smith, II
(74) Attorney, Agent, or Firm—Haynes and Boone, LLP (57) ABSTRACT

A microcolumn including a plurality of beam modification components coupled to an assembly substrate, wherein the plurality of beam modification components includes: (1) an extractor component; (2) a first focusing electrode component; (3) a first anode component; (4) a first deflector component; (5) a second focusing electrode component; (6) a second deflector component; (7) a third focusing electrode component; (8) a third deflector component; (9) a second anode component; (10) a fourth focusing electrode component; and (11) a third anode component. The beam modification components may be ordered on the substrate in this sequence or other sequences.

14 Claims, 9 Drawing Sheets

OTHER PUBLICATIONS

Dechev et al., "Microassembly of 3-D Microstructure Using a Compliant, Passive Microgripper," Journal of Microelectromechanical Systems, vol. 13, No. 2, Apr. 2004, pp. 176-189.

Tsui et al., "Micromachined end-effector and techniques for directed MEMS assembly," Journal of Micromechanics and Microengineering, Institute of Physics Publishing, United Kingdom 2004, pp. 1-8.

Ellis, et al., "High aspect ratio silicon micromechanical connectors", High Aspect Ratio Micro-Structure Technology Workshop, Jun. 15-17, 2003, Monterey, California USA.

M. Szilagyi et al., "Synthesis of Electrostatic Focusing and Deflection Systems", JVST B 15(6), Nov./Dec. 1997, pp 1971.

* cited by examiner

MEMS BASED CHARGED PARTICLE DEFLECTOR DESIGN

CROSS-REFERENCE

This application is a Continuation-In-Part (CIP) application of, and claims the benefit of, commonly-assigned U.S. patent application entitled "COMPACT MICROCOLUMN FOR AUTOMATED ASSEMBLY," application Ser. No. 10/799,836.

This application is also related to the commonly-assigned U.S. patent application entitled "MEMS MICROCONNECTORS AND NON-POWERED MICROASSEMBLY THEREWITH," application Ser. No. 10/778,460.

This invention was made with the United States Government support under DARPA contract DAAH01-03-C-R217, Phase 1, SBIR. The United States Government has certain rights in the invention.

BACKGROUND

Electron beam columns are well known for use in electron microscopy for imaging surfaces and thin samples and for electron beam lithography, such as for imaging a pattern onto a substrate. Conventional electron beam columns for electron microscopy and lithography are typically used to produce a scanning probe or to illuminate a sample or an aperture using a series of electron beam lenses, including magnetic or electrostatic lenses.

A well-known variant, the microcolumn, is a very short and small diameter electron beam column, often used in an array of such columns. Microcolumns are structures including microlenses and deflectors. In general, the microlenses are multiple layers of silicon chips or silicon membranes spaced apart by insulating layers and having bore diameters that vary from a few to several hundred $\mu$m. Such microlenses may include a plurality of microlens components or elements, accurately aligned for the purpose of focusing electron beams. Electrodes of the microlenses may include silicon membranes formed from a polished wafer containing a plurality of die, wherein a membrane may be formed at the center of each die, possibly by wet isotropic etching.

Coupling the insulating and microlens silicon layers of the microcolumn is typically achieved by anodic bonding. However, anodic bonding must be conducted at elevated temperatures, which typically requires several hours of heat-up (to approximately 400° C.) and cool-down time, as well as a physical connection of a high voltage probe, during which time drift, bond-induced shift, and expansion can degrade the alignment. This process must then be repeated for each additional layer. Because the apertures in the microlenses must be precisely aligned, assembly of the microcolumn is complex and time-consuming. For example, one assembly method requires each lens to be aligned under an optical microscope and anodically bonded one at a time. In addition, sodium ion migration from insulating layers to conductive layers during operation at elevated voltages can cause arcing and, consequently, failure of the microcolumn.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 1:
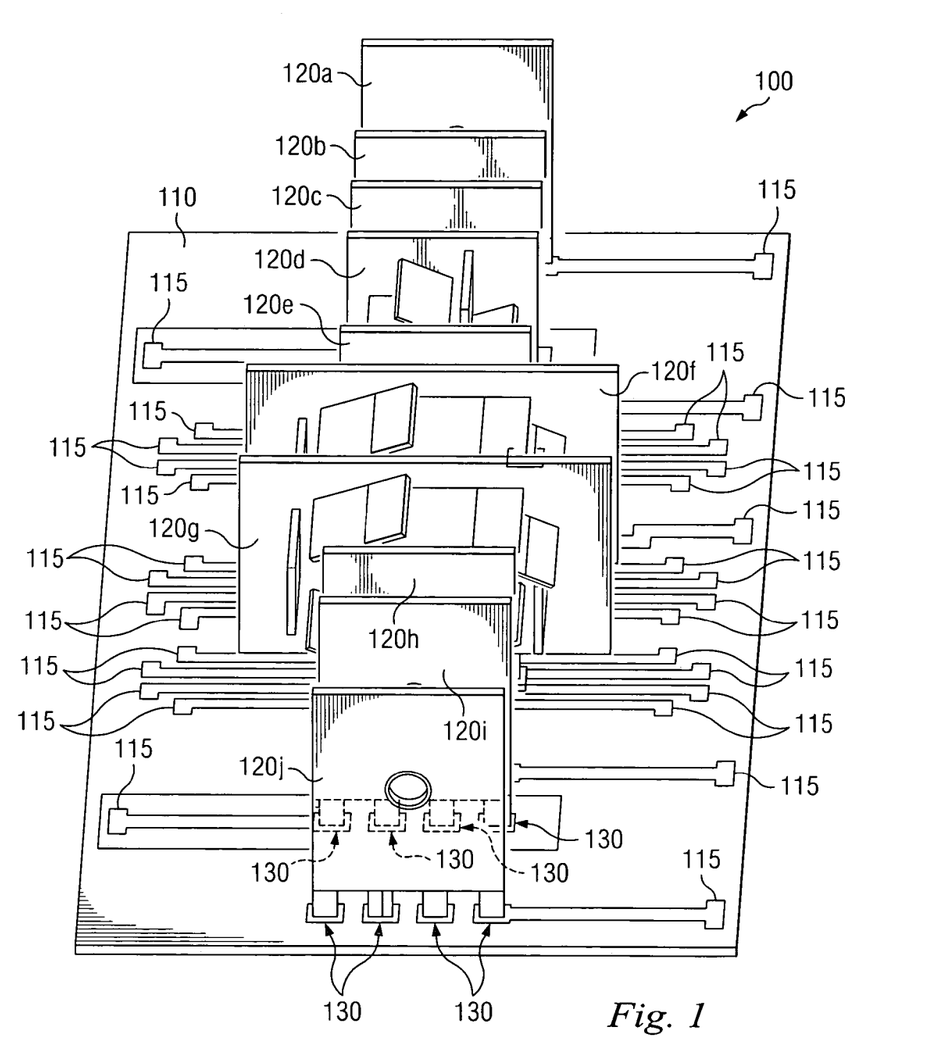
FIG. 1 illustrates a perspective view of one embodiment of a microcolumn constructed according to aspects of the present disclosure.

Referring to FIG. 1, illustrated is a perspective view of at least a portion of one embodiment of a microcolumn 100 according to aspects of the present disclosure. The microcolumn 100 includes an assembly substrate 110 and beam modification components 120a–j coupled to the assembly substrate 110. The beam modification components 120a–j may be coupled to the assembly substrate 110 by adhesive, bonding, soldering, brazing, mechanical clips and other fasteners, combinations thereof, and/or other means.

In one embodiment, the beam modification components 120a–j may be coupled to the assembly substrate 110 by connector/socket pairs, such as those shown in U.S. patent application Ser. No. 10/778,460, entitled "MEMS MICROCONNECTORS AND NON-POWERED MICROASSEMBLY THEREWITH," having Kenneth Tsui, Aaron Geisberger, and George Skidmore names as inventors, which is incorporated by reference herein in its entirety. For example, each of the beam modification components 120a–j may include an integral connector for engaging a corresponding socket 130 on the assembly substrate 110. The connectors may also be separate components bonded or otherwise coupled to the beam modification components 120a–j. The assembly substrate 110 may also include traces or other conductive members 115 electrically connected to corresponding sockets 130 for providing current and/or biasing signals to the ones of the beam modification components 120a–j.

In the illustrated embodiment, the beam modification components 120a–j include an extractor component 120a, a focusing electrode component 120b, an anode component 120c, an octupole component 120d, an aperture component 120e, deflector components 120f and 120g, and Einzel lens components 120h–j. Of course, embodiments within the scope of the present disclosure are not limited to the assembly shown in FIG. 1. For example, the microcolumn 100 may include additional and/or alternative beam modification components. The number of beam modification components employed in the microcolumn 100 is also not limited by the scope of the present disclosure, such that embodiments may include more or fewer beam modification components than in the illustrated embodiment.

As also shown in FIG. 1, one or more of the beam modification components 120a–j may be oriented substantially perpendicular to the assembly substrate 110 and substantially parallel to each other. However, such an orientation is not required in every embodiment, such that the beam modification components 120a–j may be oriented at acute angles relative to each other and/or to the assembly substrate 110. Moreover, while each of the illustrated beam modification components 120a–j are substantially planar and several have substantially similar footprint profiles and areas, other configurations are within the scope of the present disclosure. In one embodiment, one or more or all of the beam modification components 120a–j have a footprint of less than about 2 cm². For example, a number of the beam modification components 120a–j may have a footprint of about 1 cm².

Figure 2:
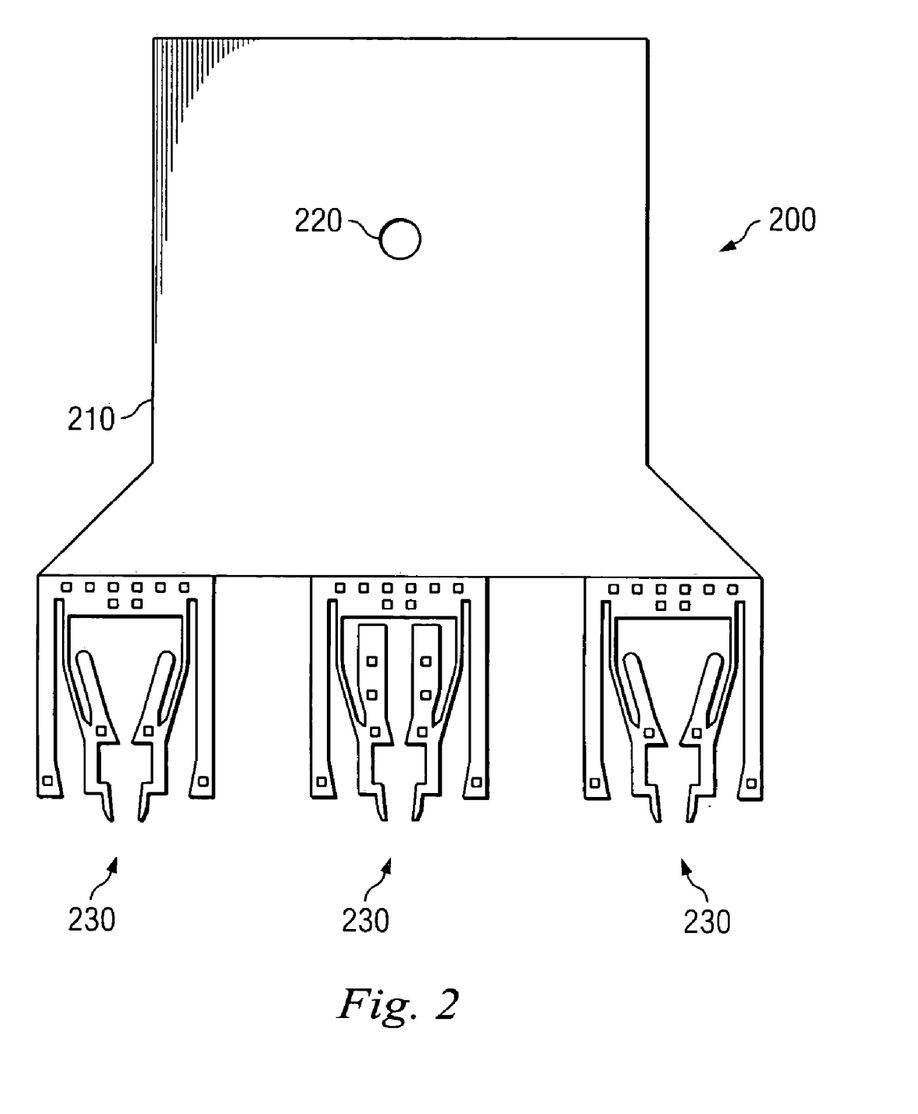
FIG. 2 illustrates a plan view of one embodiment of a beam modification component constructed according to aspects of the present disclosure.

Referring to FIG. 2, illustrated is a plan view of at least a portion of one embodiment of a beam modification component 200 constructed according to aspects of the present disclosure. The beam modification component 200 may be substantially similar to one or more of the beam modification components 120a–j shown in FIG. 1.

The beam modification component 200 includes a component substrate 210 having a through-hole aperture 220. The through-hole aperture 220 may be sized based on the intended purpose of the beam modification component 200. For example, if the beam modification component 200 is to be employed as an extractor component, the aperture 220 may be smaller than the diameter of an incident electron beam. Accordingly, the beam modification component 200 may physically extract, deflect, or otherwise prevent from passing fringe components of an incident electron beam or otherwise reduce the diameter of the electron beam by removing portions of the electron beam. Such a beam modification component 200 may also be employed as a spray aperture component or a blanker component.

Another beam limiting function for which the beam modification component 200 may be employed is setting the beam convergence angle. Optimizing the beam convergence angle, which may be measured as the half-angle of the beam at the target, may control the effect of lens aberrations and resolution, and may also be achieved by appropriately sizing the aperture 220. The size of the aperture 220 may also be sized to set the beam current.

While not limited within the scope of the present application, the diameter of the aperture 220 in the above-described functions may range between about 5 $\mu$m and about 1000 $\mu$m. Moreover, the aperture 220 may have a substantially circular shape, as shown in FIG. 2, or other shapes. For example, the shape of the aperture 220 may be substantially square, triangular, pentagonal, hexagonal, octagonal, or other polygonal shapes, as well as other irregular shapes.

The beam modification component 200 may also include connectors 230 for coupling the component 200 to corresponding sockets 130 on the assembly substrate 110 shown in FIG. 1. The connectors 230 may be conductive or include conductive members, such that a desired current and/or bias may be passed from the assembly substrate 110 to the beam modification component 200. The component substrate 210 may be conductive, or semiconductive, and may be electrically coupled to the connectors 230 or conductive portions thereof. Accordingly, the beam modification component 200 may be held at a bias potential, such as when the component 200 is employed as a focusing electrode component, an anode component, or an Einzel lens component.

In one embodiment, the beam modification component 200 may be configured to be heated, such as to prevent the formation of contamination deposits. Heat sources employed for such heating may including external or local heaters or lasers. Ohmic heating may also be employed, in which case the beam modification component 200 may include traces or coils.

Figure 3:
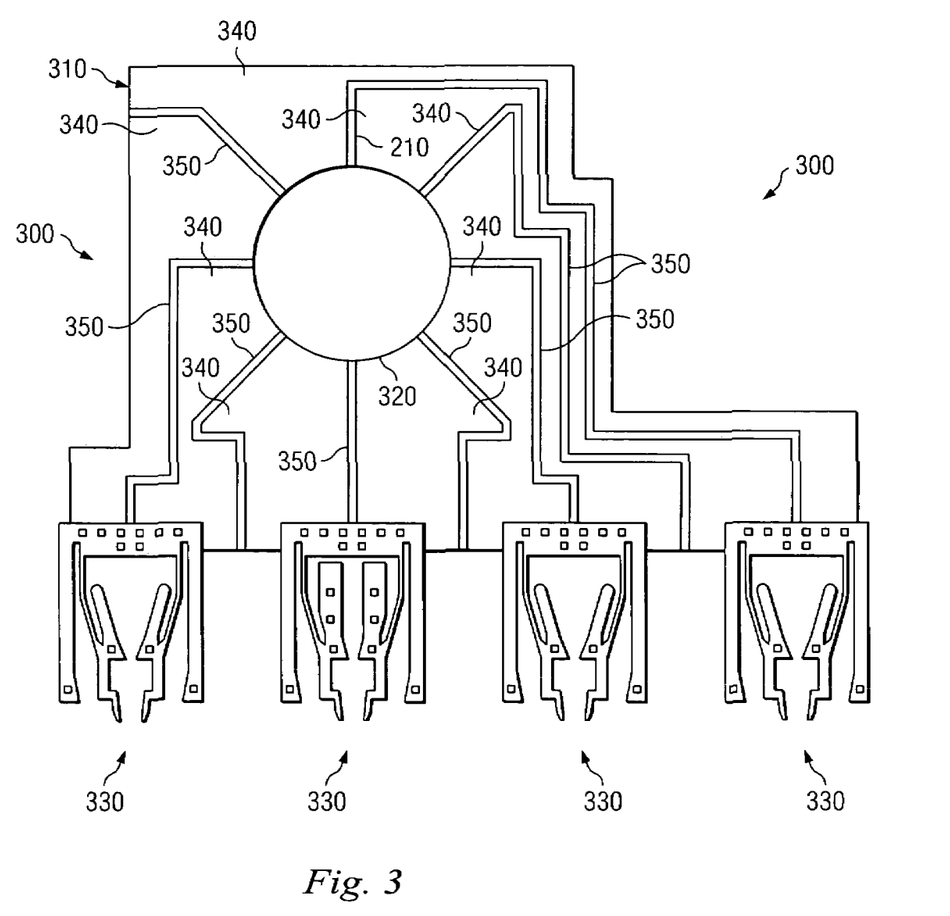
FIG. 3 illustrates a plan view of another embodiment of a beam modification component constructed according to aspects of the present disclosure.

Referring to FIG. 3, illustrated is a plan view of at least a portion of another embodiment of a beam modification component 300 constructed according to aspects of the present disclosure. The beam modification component 300 may be substantially similar to one or more of the beam modification components 120a–j shown in FIG. 1.

The beam modification component 300 includes a component substrate 310 having a through-hole aperture 320. The through-hole aperture 320 may be sized to permit the transmission of all or a substantial portion of an incident electron beam. The beam modification component 300 also includes connectors 330 for coupling to corresponding sockets 130 on the assembly substrate 110 shown in FIG. 1. The connectors 330 may be conductive or include conductive portions, thereby interconnecting traces or conductors 115 on the assembly substrate 110 to corresponding electrodes 340 formed on or integral to the component substrate 310. For example, in the embodiment shown in FIG. 3, the beam modification component 300 includes 8 electrodes 340 and 4 connectors 330 each having two conductors electrically coupled to a corresponding electrode 340. The electrodes 340 may be randomly or regularly distributed about the aperture 320, and may be isolated from one another by trenches 350 filled with nitride, silicon nitride, silicon dioxide, and/or other insulating materials. However, in some embodiments, the beam modification component 300 (and others described herein) may not include such trenches 350.

The beam modification component 300 may be employed as a deflector or a focusing element by biasing the electrodes 340 in a predetermined configuration. For example, the electrodes 340 may be biased at similar potentials to focus an electron beam, or opposing ones of the electrodes 340 may be biased at different potentials to deflect or steer the electron beam. Such focusing and deflection may also be performed simultaneously.

Figure 4:
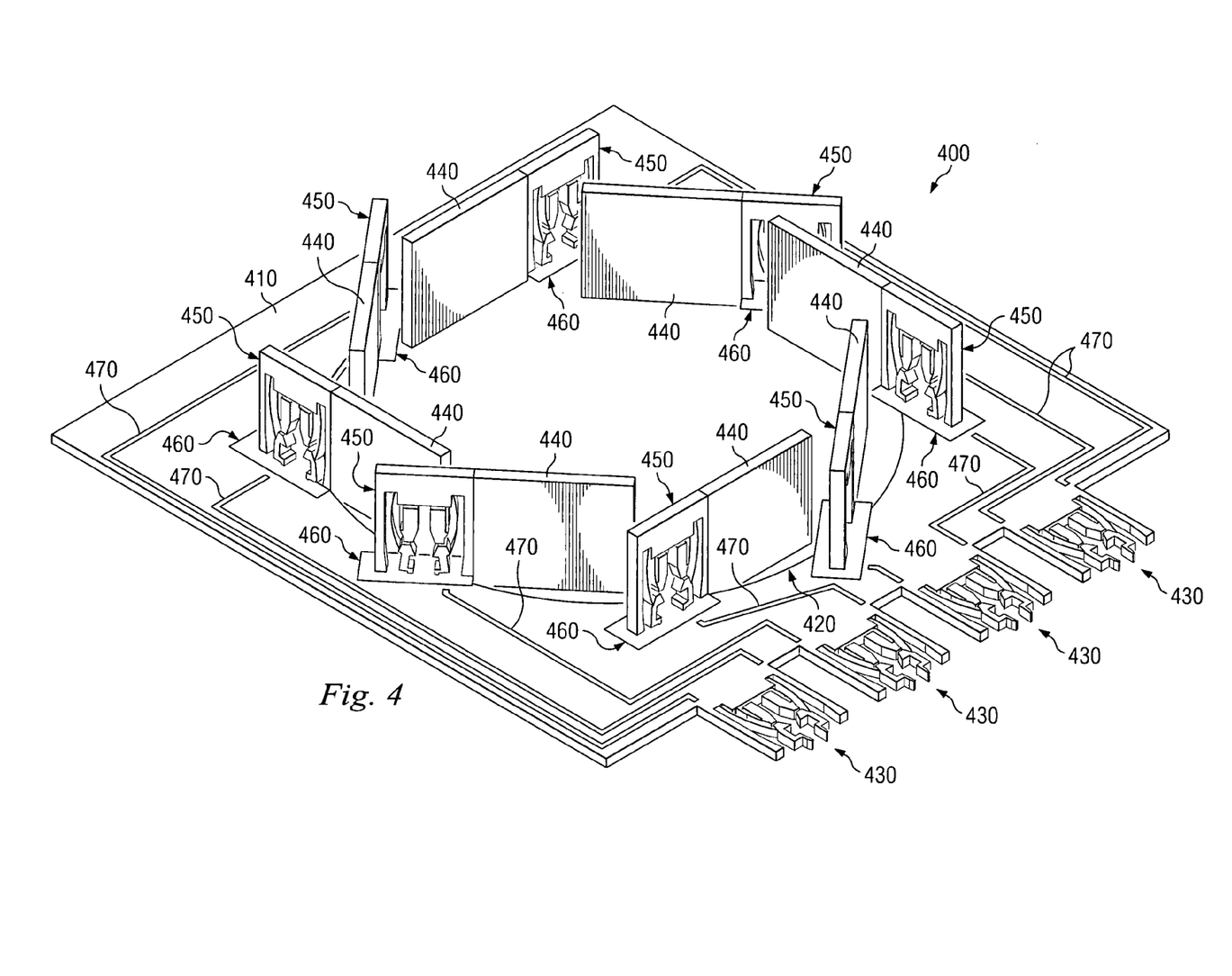
FIG. 4 illustrates a perspective view of another embodiment of a beam modification component constructed according to aspects of the present disclosure.

Referring to FIG. 4, illustrated is a perspective view of at least a portion of another embodiment of a beam modification component 400 constructed according to aspects of the present disclosure. The beam modification component 400 may be substantially similar to one or more of the beam modification components 120a–j shown in FIG. 1.

The beam modification component 400 includes a component substrate 410 having a pass-through aperture 420 and connectors 430 for coupling to corresponding sockets 130 on the assembly substrate 110 shown in FIG. 1. The beam modification component 400 also includes biasing plates or otherwise-shaped members 440 each having a connector 450 for coupling to a corresponding socket 460 on the component substrate 410. The connectors 450 and component sockets 460 may be substantially similar to the connectors 430 and sockets 130. The beam modification component 400 may be configured as an octupole, having 8 biasing plates 440, or a quadrupole, having 4 biasing plates 440. Of course, the number of biasing plates 440 included in each beam modification component 400 is not limited within the scope of the present application. The biasing plates 440 may also overlap the edge of the aperture 420, possibly extending at least partially into the aperture 420, such as to shield the electron beam from being influenced by the edge.

The component substrate 410 also includes traces 470 to provide conductivity between the sockets 130 on the assembly substrate 110 and the biasing plates 440 via the connectors 430, the component sockets 460, and the biasing plate connectors 450, collectively. Accordingly, the biasing plates 440 may be biased at similar or varying potentials as with the electrodes 340 of the beam modification component 300 shown in FIG. 3.

Figure 5A:
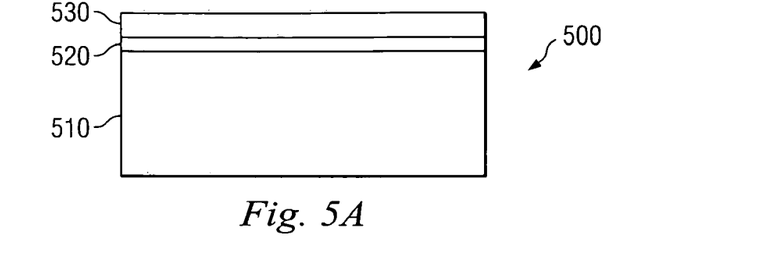
FIGS. 5A–5D illustrate sectional views of sequential stages of one embodiment of a method of manufacturing a microcolumn component according to aspects of the present disclosure.

Referring to FIG. 5A, illustrated is a sectional view of at least a portion of one embodiment of a component or substrate in the microcolumn 100 shown in FIG. 1, herein designated by the reference numeral 500, in an intermediate stage of manufacture according to aspects of the present disclosure. In one embodiment, the manufacturing stage depicted in FIG. 5A may be an initial stage. The manufacturing method contemplated by FIG. 5A and subsequent figures may be employed during the manufacture of the assembly substrate 110 and the beam modification components 120a–j shown in FIG. 1, the beam modification components 200, 300, 400 shown in FIGS. 2–4, respectively, and/or other components included in the microcolumn 100 of FIG. 1.

As shown in FIG. 5A, the component 500 includes a substrate 510 which, at least in one embodiment, may be a silicon-on-insulator (SOI) substrate. An insulating layer 520 may be included in the substrate 510 or may be formed on or over the substrate 510. The insulating layer 520 may comprise silicon dioxide and/or other insulating materials, and may comprise more than one layer. The insulating layer 520 may also be or include a buried oxide layer, such as that formed by implanting oxide ions into the substrate 510. A device layer 530 may also be included in the substrate 510 or may be formed on or over the insulating layer 520. The device layer 530 may comprise silicon, doped polysilicon, and/or other conductive or semiconductive materials, and may comprise more than one layer. The device layer 530 may also comprise an insulator coated with a conductive material. In one embodiment, the device layer 530 may have a thickness of about 50 $\mu$m.

Figure 5B:
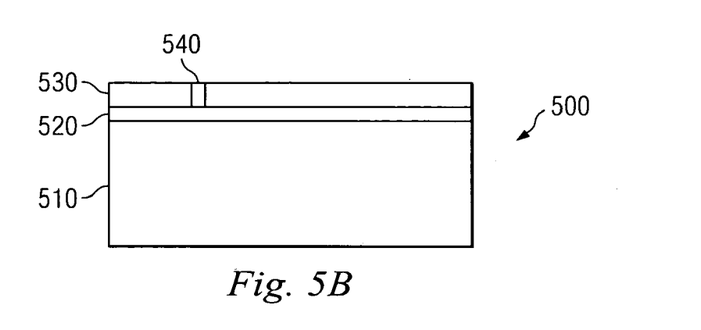

Referring to FIG. 5B, illustrated is a sectional view of the component 500 shown in FIG. 5A in a subsequent stage of manufacture according to aspects of the present disclosure. One or more isolation structures 540 may be formed extending through the device layer 530 to the insulating layer 520 and/or the substrate 510. The isolation structures 540 may be or include shallow trench isolation structures or other features possibly formed by etching recesses or other openings in the device layer 530 and subsequently filling the openings with one or more insulating materials. The isolation structures 540 may comprise nitride, silicon nitride, silicon dioxide, and/or other materials. The isolation structures 540 may be employed to define electrodes on the component 500, such as the electrodes 340 described above in regard to FIG. 3. The isolation structures 540 may also be employed to electrically isolate features formed on the component 500, such as the traces 115 and 470 described above in regard to FIGS. 1 and 4, respectively. In one embodiment, multiple instances of the component 500 may be formed on a single substrate, wafer, chip or die area. For example, the assembly substrate 110 and each of the beam modification components 120a–j, including sub-components thereof, may be formed from or on a common substrate. In such an embodiment, the isolation structures 540 may be employed to electrically isolate each of these components.

Figure 5C:
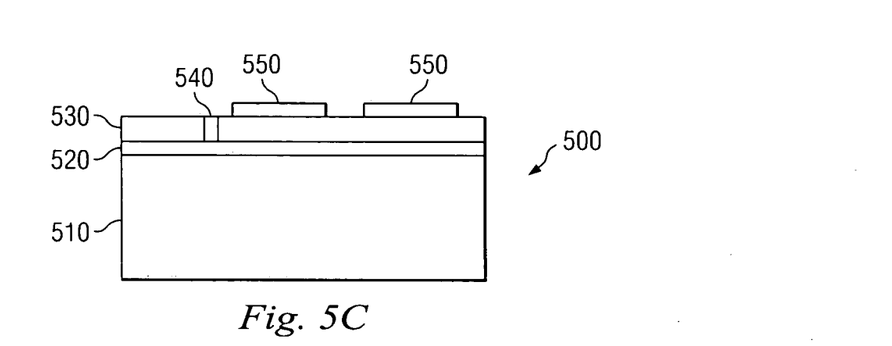

Referring to FIG. 5C, illustrated is a sectional view of the component 500 shown in FIG. 5B in a subsequent stage of manufacture according to aspects of the present disclosure. A conductive layer 550 is formed over the device layer 530, such as by selective deposition or by blanket deposition followed by a patterning process. The conductive layer 550 may comprise gold, platinum, silver, aluminum, doped polysilicon, alloys thereof, and/or other materials. The conductive layer 550 is patterned to form traces and/or electrodes on the device layer, such as the electrodes 340 shown in FIG. 3, the traces 115 on the assembly substrate 110 in FIG. 1, and the traces 470 of the component substrate 410 shown in FIG. 4.

Figure 5D:
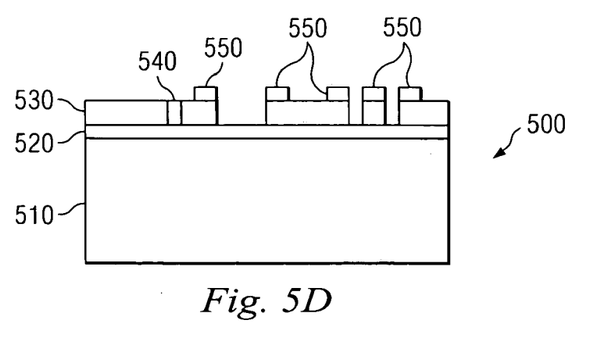

Referring to FIG. 5D, illustrated is a sectional view of the component 500 shown in FIG. 5C in a subsequent stage of manufacture according to aspects of the present disclosure. The device layer 530 and/or the conductive layer 550 are patterned to form connectors and/or sockets, such as the connectors 230, 330, and 430 shown in FIGS. 2, 3, and 4, respectively. The device layer 530 and/or the conductive layer 550 may also be patterned to form traces and/or electrodes on the device layer, such as the electrodes 340 shown in FIG. 3, the traces 115 on the assembly substrate 110 in FIG. 1, and the traces 470 on the component substrate 410 in FIG. 4. The patterning contemplated in FIG. 5D may also be employed to define the component 500 itself, such as the assembly substrate 100 and/or beam modification components 120a–j shown in FIG. 1, and/or the beam modification components 200, 300, and 400 shown in FIGS. 2, 3, and 4, respectively.

In one embodiment, the substrate 510 may be sized such that the assembly substrate and all or a portion of the beam modification components employed in a single microcolumn may be defined in the device layer of a single substrate, wafer, chip, or die. In another embodiment, the assembly substrate and/or the beam modification components may be fabricated from multiple substrates, including those of different compositions. For example, the assembly substrate may be fabricated from a substrate having a nickel layer insulated over a Pyrex bulk layer and one or more of the beam modification components may be fabricated from another type of substrate.

In a subsequent processing step, all or portions of the insulating layer 520 may be removed, such as by one or more wet or dry etching processes. Consequently, at least a portion of the device layer 530 may be "released" from the substrate 510. However, a portion of the device layer 530 may also be tethered to the substrate by a portion or "tether" of the device layer extending between released and non-released portions. Accordingly, the released portion of the device layer 530 may be maintained in a substantially known position to facilitate capture of a released portion of the device layer 530 during a subsequent assembly process.

Figure 6:
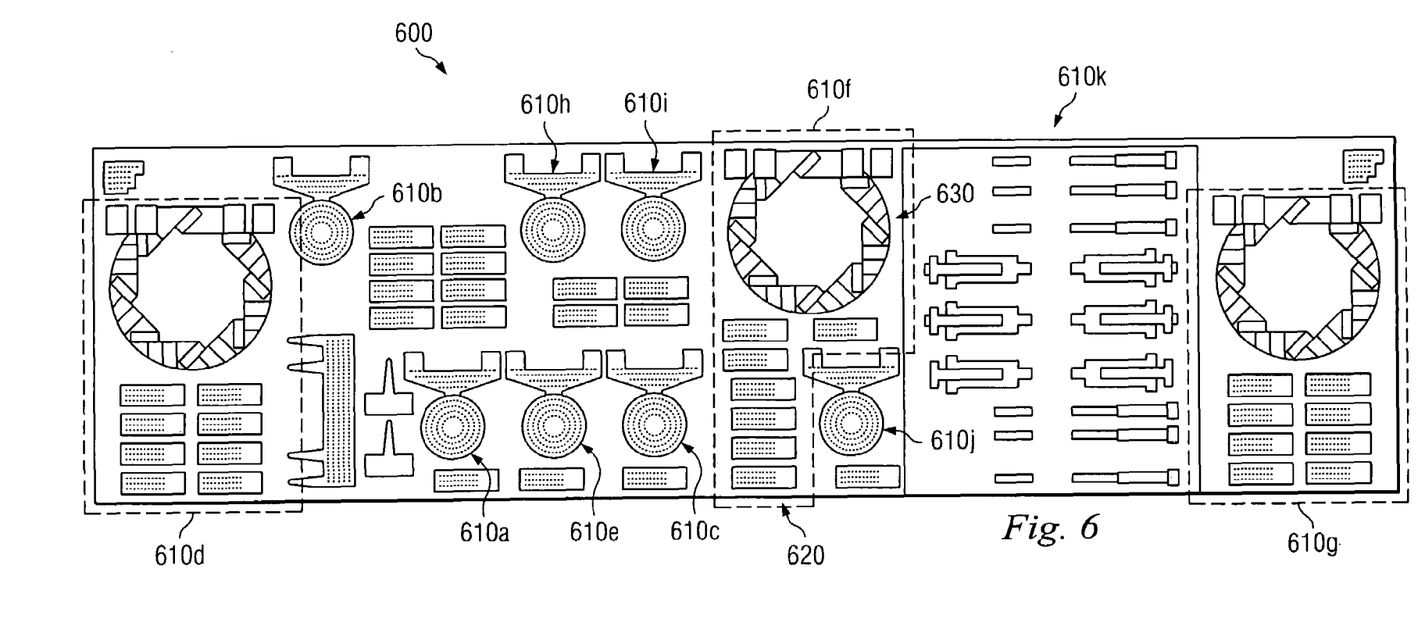
FIG. 6 illustrates a perspective view of one embodiment of a substrate from which a microcolumn may be assembled according to aspects of the present disclosure.

Referring to FIG. 6, illustrated is a perspective view of at least a portion of one embodiment of a substrate 600 having components 610a–k formed thereon to be employed in the assembly of a microcolumn according to aspects of the present disclosure. The microcolumn to be assembled from the components 610a–k may be substantially similar to the microcolumn 100 shown in FIG. 1.

For example, the components 610a–k include an extractor component 610a which may be substantially similar to the extractor component 120a in FIG. 1. The components 610a–k also include a focusing electrode component 610b which may be substantially similar to the focusing electrode component 120b, an anode component 610c which may be substantially similar to the anode component 120c, an octupole component 610d which may be substantially similar to the octupole component 120d, an aperture component 610e which may be substantially similar to the aperture component 120e, deflector components 610f and 610g which may be substantially similar to the deflector components 120f and 120g, and Einzel lens components 610h–j which may be substantially similar to the Einzel lens components 120h–j. The components 610a–k also include assembly substrate 610k, which may be substantially similar to the assembly substrate 110 of FIG. 1.

During one embodiment of an assembly method, the extractor component 610a may be removed from the substrate 600 and assembled to the assembly substrate 610k. Such assembly may be performed by one or methods described in "MEMS MICROCONNECTORS AND NON-POWERED MICROASSEMBLY THEREWITH" incorporated herein. For example, a manipulation probe may be oriented proximate the extractor component 610a such that the manipulation probe and a handle portion of the extractor component 610a may be engaged. A tether portion of the extractor component 610a may then be severed, such as by physically cutting the tether with a probe and/or by other means, and/or by lifting the extractor component away from the substrate 600 until the tether is broken, thereby freeing the extractor component 610a from the substrate 600.

Thereafter, the manipulation probe may be rotated, translated, and/or otherwise manipulated to orient the extractor component 610a proximate an assembly location on the assembly substrate 610k. In one example, such orientation of the extractor component 610a may include orienting a connector portion of the extractor component 610a proximate a socket on the assembly substrate 610k. Thereafter, the manipulation probe may be further manipulated such that the connector of the extractor component 610a becomes engaged with the socket on the assembly substrate 610k. Moreover, positioning of the manipulation probe and the de-tethering, orientation, and assembly of the extractor component 610a may be performed by an automated process.

These procedures may be repeated as necessary to assemble the remaining components 610b–j to the assembly substrate 610k. The components 610b–j may be assembled in any order, although in one embodiment they are assembled in the order in which they will be encountered by an electron beam.

The assembly of the octupole component 610d and the deflector components 610f and 610g may be performed by similar procedures. For example, the octupole component 610d may be assembled by first assembling biasing plates 620 to a component substrate 630 and subsequently assembling the component substrate 630 to the assembly substrate 610k. The assembly of the biasing plates 620 may be performed by similar processes employed to assemble the components 610a–j to the assembly substrate 610k, and may be partially or completely automated, as described above.

Robotic stages may be used to assemble the microcolumn components 610a–j to the assembly substrate 610k. In one embodiment, the robotic stages may be controlled using a computer and user interface. For example, a user may develop a scripted program employed to automate the entire assembly process, or a substantial portion thereof, employing the same manipulator probe, connectors and sockets. The program may govern positioning of the manipulation probe, de-tethering, orientation, and assembly of the components. Moreover, by employing multiple manipulator probes, the same program may be employed to assemble more than one component in parallel, possibly yielding multiple microcolumns.

Figure 7A:
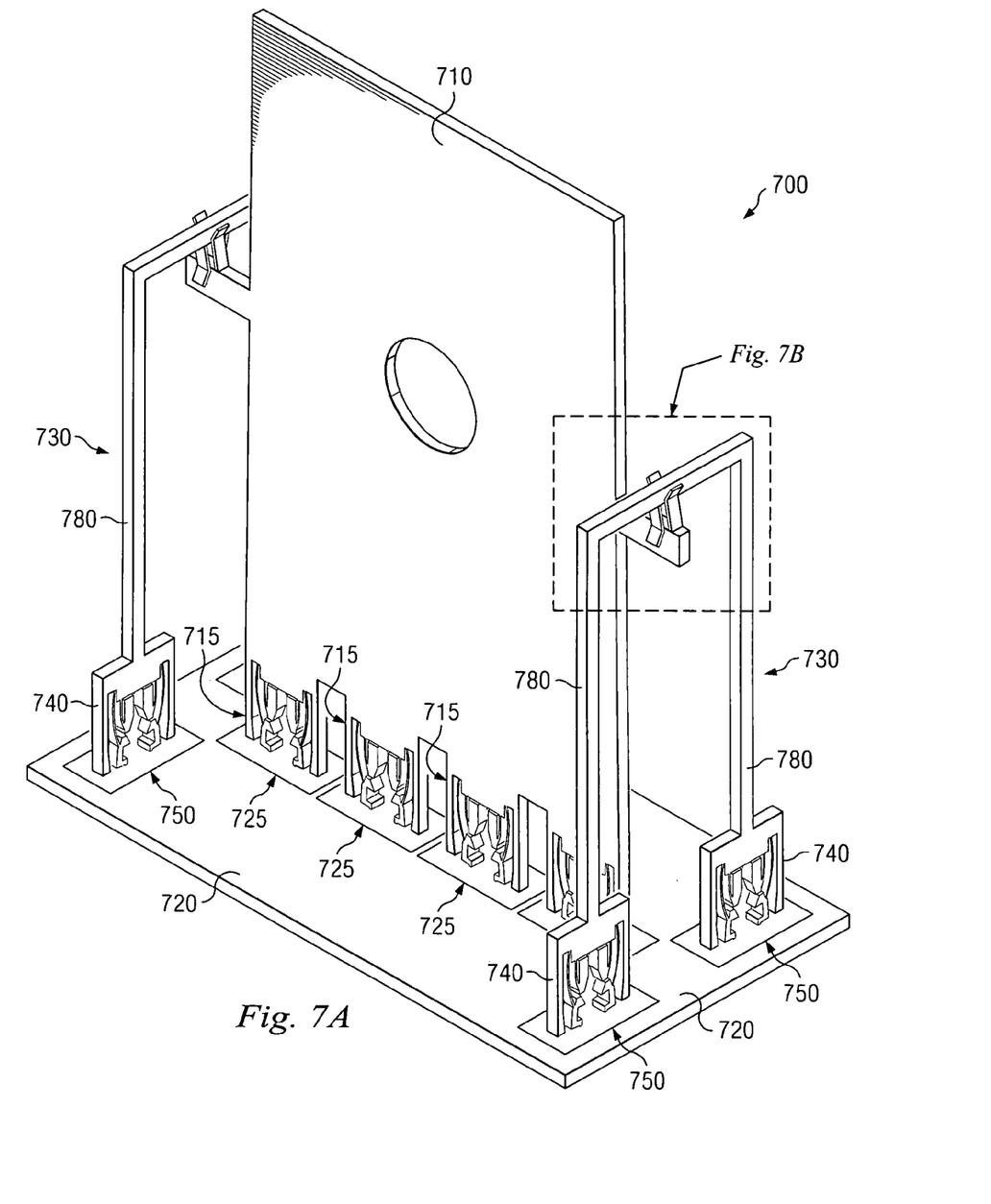
FIGS. 7A and 7B illustrate perspective views of one embodiment of a clamped assembly constructed according to aspects of the present disclosure.

Referring to FIG. 7A, illustrated is a perspective view of at least a portion of another embodiment of an assembly 700 of a beam modification component 710 and an assembly substrate 720. The assembly 700 may be included in the microcolumn 100 of FIG. 1. The beam modification component 710 and the assembly substrate 720 may be substantially similar to any of the beam modification components and assembly substrates described above. The assembly 700 also includes one or more clamp components 730 assembled to the assembly substrate 720 and the beam modification component 710. The clamp component(s) 730 may improve angular alignment, may increase the resonant frequency of the beam modification component 710, and/or may make the assembly 700 more robust.

Each clamp component 730 includes connectors 740 for engaging corresponding sockets 750 on the assembly substrate 720. The clamp components 730 also include connectors 760, shown in FIG. 7B, for engaging the beam modification component 710 or connectors 770 thereof. Extensions 780 extend between the connectors 740 and the connectors 760. Each of the connectors 760, 770 may include biasable and/or flexible members for frictionally, pre-stressed, and/or otherwise engaging surfaces of a mating component.

Figure 7B:
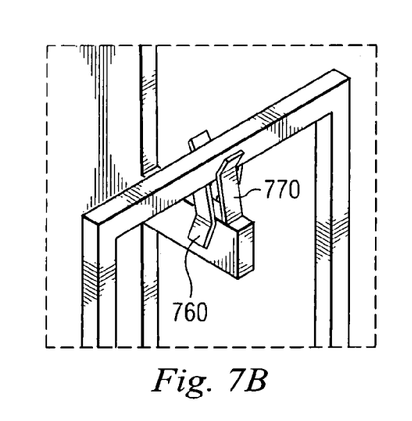

During assembly, the beam modification component 710 may be assembled to the assembly substrate 720, possibly by the assembly procedures described above. Such assembly may include engaging connectors 715 of the beam modification component 710 with sockets 725 of the assembly substrate 720. This assembly may also be automated, as described above. The clamp components 730 may then be assembled individually or simultaneously. During this assembly, the connectors 740 may be engaged with the sockets 750 while the connectors 760 and 770 simultaneously engage.

Figure 8:
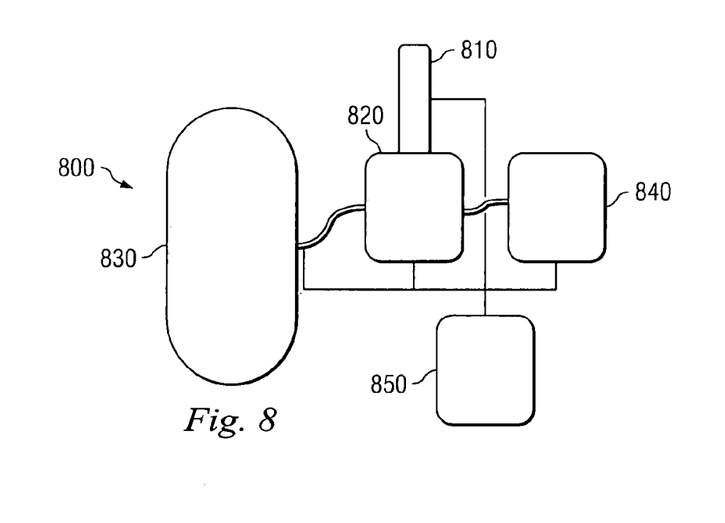
FIG. 8 illustrates a schematic view of one embodiment of a microcolumn system according to aspects of the present disclosure.

Referring to FIG. 8, illustrated is a schematic view of at least a portion of one embodiment of a microcolumn system 800 constructed according to aspects of the present disclosure. The system 800 is one environment in which the microcolumn 100 of FIG. 1 may be implemented. For example, the system 800 includes a column 810 which includes a electron emitter and a microcolumn, wherein the microcolumn may be substantially similar to the microcolumn 100 shown in FIG. 1.

The system 800 also includes a specimen chamber 820 including a stage and/or other means for supporting and possibly orienting a specimen undergoing investigation by the system 800. The specimen chamber 820 may also house detectors and/or other means for detecting effects of the electron beam on a specimen. The detectors may be employed to determine a chemical composition of the specimen, to determine geometries of features of the specimen, or for other functions of the system 800. Thus, the system 800 may be employed for SEM, mass spectroscopy, metrology, e-beam lithography, and/or other investigative processes employing microcolumns and electron or charged ion beams. The specimen chamber 820 may also include still or video imaging means for capturing macroscopic images of the specimen and its orientation in the chamber 820.

The system 800 may also include a tank 830 for holding liquid nitrogen or other coolants which may be employed to cool the detectors in the specimen chamber 820. The system 800 may also include a vacuum system 840 coupled to the chamber 820 for evacuating the chamber 820, including to levels below atmospheric pressure. A controller 850 may be coupled to one or more of the column 810, the chamber 820, the tank 830 or valve thereof, and the vacuum system 840, for controlling operation thereof.

Figure 9:
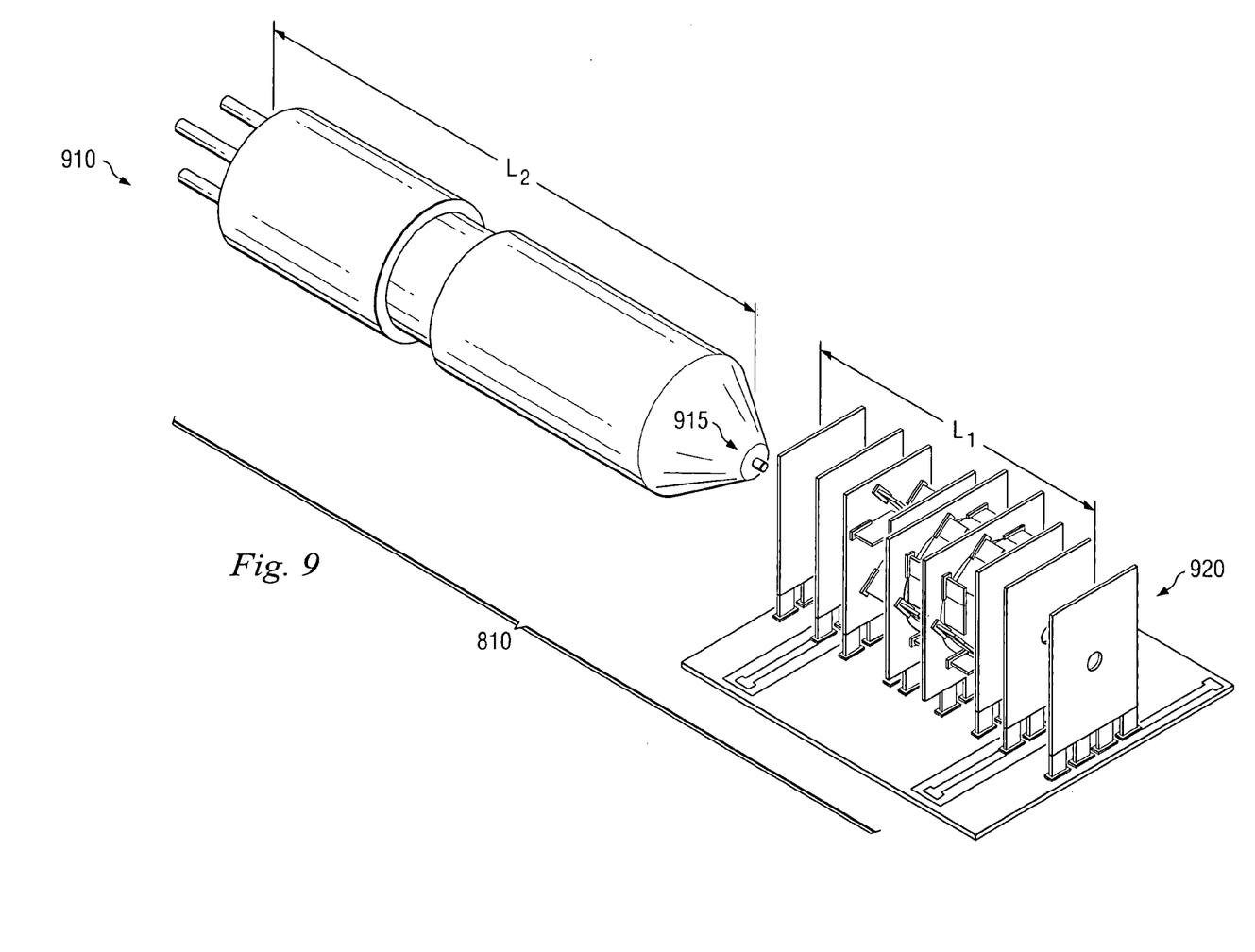
FIG. 9 illustrates a perspective view of a portion of the microcolumn system shown in FIG. 8.

Referring to FIG. 9, illustrated is one embodiment of at least a portion of the column 810 shown in FIG. 8. The column 810 includes an electron gun, emitter, and/or other electron source (hereafter collectively referred to as an electron gun) 910 and a microcolumn 920. In one embodiment, the combination of the electron gun 910 and the microcolumn 920, and possibly other components, may be a microcolumn system.

The microcolumn 920 may be substantially similar to the microcolumn 100 shown in FIG. 1. The electron gun 910 may be a thermionic electron gun, a field emission gun, or other type of electron emission device. In the illustrated embodiment, the electron gun 910 has a length about equal to 2.5 times the length of the microcolumn 920. For example, the microcolumn 920 may have a length $L_1$ (measured between outside beam modification components) of about 10 mm or less, such that the electron gun 910 may have a length $L_2$ of about 25 mm or less. However, in other embodiments the ratio of the length of the electron gun 910 to the length of the microcolumn 920 may be less than about 2.5, including as low as about 1:1, or lower.

The electron gun 910 may include an emitter tip 915 from which electrons are emitted in response to thermal energy and/or an applied electric field (e.g., a Schottky source). However, a cold field emitter may also or alternatively be employed. In one embodiment, wafer/lithography processes (such as those described in reference to FIGS. 5A–5D) may be employed to fabricate the apparatus 910/915 instead of employing the electron gun 910 depicted in FIG. 9. For example, the electron gun 910 may be fabricated from a substrate, as with the beam modification components described above, and may include a "tip" comprising one or more carbon nanotubes, copper, tungsten, zirconium oxide, silicon, silicon oxide, titanium, and/or other materials, and assembled to the assembly substrate in front of other beam modification components. However, other conventional and/or future-developed types of emitters may also or alternatively be employed within the scope of the present disclosure.

Thus, the present disclosure provides a microcolumn including, in one embodiment, an assembly substrate and a plurality of beam modification components. The assembly substrate includes a plurality of sockets, and the beam modification components each include a connector coupled to a corresponding one of the sockets.

The present disclosure also introduces a clamp for supporting a MEMS component coupled to a MEMS substrate. The claim includes an extension member and first and second connectors. The first connector is coupled to a first end of the extension member and is configured to engage a socket on the MEMS substrate. The second connector is coupled to a second end of the extension member and is configured to engage a feature of the MEMS component.

A method of manufacturing a microcolumn is also provided in the present disclosure. In one embodiment, the method includes providing a substrate having a device layer formed over an insulating layer. Portions of the device layer are removed to form: (1) an assembly substrate having a plurality of sockets and (2) a plurality of beam modification components each having a connector. The manufacturing method further includes releasing the beam modification components and assembling the beam modification components to the assembly substrate by coupling the connectors of the beam modification components to corresponding ones of the sockets. Assembly of the beam modification components may employ automation and/or automated calibration, including employing automated motion of robotic stages in a substantially automated manner.

The present disclosure also provides a microcolumn system including an electron gun and a microcolumn substantially aligned with the electron gun for modifying an electron beam produced by the electron gun. The microcolumn may include an assembly substrate having a plurality of sockets and a plurality of beam modification components each having a connector coupled to a corresponding one of the sockets.

Figure 10:
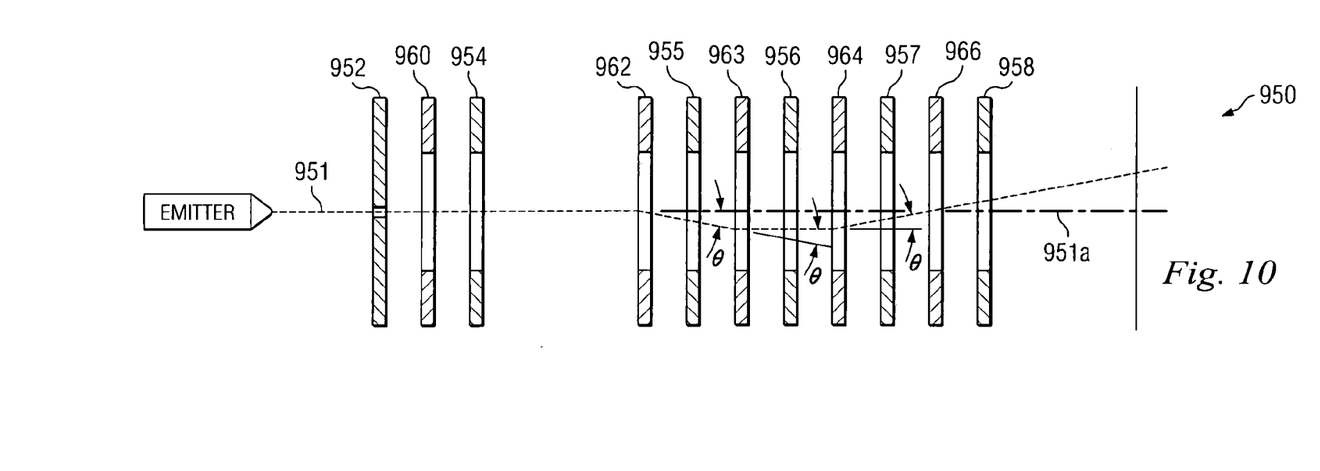
FIG. 10 illustrates a schematic view of one embodiment of a microcolumn according to aspects of the present disclosure.

Referring to FIG. 10, illustrated is a schematic view of at least a portion of another embodiment of the microcolumn 100 shown in FIG. 1, herein designated by reference numeral 950, according to aspects of the present disclosure. The microcolumn 950 includes, in order, an extractor component 952, a focusing electrode component 960, an anode component 954, a deflector component 962, an additional focusing electrode component 955, an additional deflector component 963, an additional focusing electrode component 956, an additional deflector component 964, an additional anode component 957, an additional focusing electrode component 966, and a final anode component 958. The anode components 957, 958 and the focusing electrode component 966 may collectively form an Einzel lens if substantially equal potentials are applied to the anode components 957, 958. Each of the beam modification components 952, 954–958, 960, 962–964, 966 may be substantially similar to one or more of the beam modification components described above. Of course, other embodiments within the scope of the present disclosure may include additional or alternative beam modification components, as well as sequences other than as shown in FIG. 10.

In the illustrated embodiment, the deflector component 962 deflects an electron beam 951 away from a central axis 951A. The central axis 951A may or may not be substantially aligned with an emitter or other electron beam source. The deflector component 963 deflects the beam 951 back toward the central axis 951A, such that the beam 951 may again be substantially parallel to, although offset from, the central axis 951A. The deflector component 964 deflects the beam 951 toward the central axis 951A once again, although possibly in a different direction relative to the deflection caused by the deflector component 962. In this manner, the beam 951 may be directed at various points in a desired field of view.

The individual deflections caused by each of the deflector components 962–964 may be substantially similar, or each about equal to an angle θ. In such an embodiment, the beam deflection signals applied to the deflector components 962–964 may be substantially similar in magnitude and/or amplitude. However, because the deflector component 962 deflects the beam 951 away from the central axis 951A in a first direction, while the deflector components 963, 964 each deflect the beam 951 in a second direction relative to the central axis 951A, the beam deflection signal applied to the deflector component 962 may be opposite in polarity and/or out of phase relative to the beam deflection signals applied to the deflector components 963, 964. In some embodiments, employing such common or similar voltage, current, or power levels to drive the beam deflection signals applied to each of the deflector components 962–964 may reduce the complexity of the accompanying voltage, current, and/or power sources and related circuitry.

In some embodiments, the desired deflection to be achieved by the deflector component 962 may be substantially equal to the maximum deflection achievable by the deflector component 962. In other embodiments, the desired deflection may be greater than the maximum deflection achievable by the deflector component 962. In such embodiments (and possibly others), more than one instance of the deflector component 962 may be employed. Thus, reference herein to the deflector component 962 may actually refer to a collection of multiple deflector components (e.g., a deflector component assembly, a group of deflector components, etc.). In such reference, each of the multiple components referred to as the deflector component 962 may be substantially similar or identical. The number of components in such a group, collection, or sub-assembly of deflection components collectively forming the deflector component 962 may be about equal to the quotient of the desired deflection and the maximum deflection achievable by a single deflection component.

This concept may also apply to the deflector components 963, 964, individually or collectively. Thus, the deflector component 963 may include or refer to multiple instances of the deflector component 963, and the deflector component 964 may include or refer to multiple instances of the deflector component 964. In an exemplary embodiment, the desired deflection to be accomplished by the deflector component 962 may be about five degrees in a first direction away from a centerline axis, and the desired deflection to be collectively accomplished by the deflector components 963, 964 may be about five degrees in a second direction away from the centerline axis, possibly opposite the first direction. However, because the deflector components 963, 964 are deflecting a beam that has already been deflected by the deflector component 962 in an opposite direction, the desired deflection by the deflector components 963, 964 may actually be about 10 degrees. Moreover, the desired deflections in the first and second directions (each five degrees away from a centerline axis in this example) may not be substantially equal in all embodiments.

In this example, the maximum deflection which each of the deflector components 962–964 may cause may be about five degrees, such that each of the deflector components 962–964 may only comprise one deflector component operated at about its maximum operating voltage, or each of the deflector components 962–964 may comprise two deflector components operated at voltages substantially less than their maximum operating voltages. However, if the maximum deflection which each of the deflector components 962–964 may cause may be about two degrees (as individual components), each of the deflector components 962–964 may comprise three deflector components. That is, the quotient of the desired deflection of the deflector component 962 (five degrees in this example) and the maximum deflection achievable by an individual instance of the deflector component 962 (two degrees in this example) may be about equal to 2.5, such that the deflector component 962 actually comprises at least three individual deflector components in order to achieve the desired deflection.

Moreover, the maximum voltage, current, or power employed to drive the beam deflection signals may be reduced in some embodiments within the scope of the present disclosure. For example, a desired beam deflection may call for a beam deflection signal having a peak voltage of about 200 V to be applied to a deflector component. However, the voltage applied to the deflector component may be limited to 25 V, perhaps due to environmental restrictions, physical limitations of the deflector component (e.g., breakdown voltage), or energy conservation mandates, among other possible reasons. Also, in some embodiments, the electronic amplifiers employed to drive 25 V may be considerably cheaper than those employed to drive 200 V, and may allow for on-board or on-chip amplifiers. Thus, to achieve the desired beam deflection, multiple deflector components may be employed in succession to incrementally deflect the beam until the desired beam deflection is achieved.

According to aspects of the present disclosure, even though the thickness of a flat plate deflector component may be about 50 μm, which is substantially less than the conventional deflector thickness of about 500 μm, the actual effective length may be closer to 500 μm, because the deflector fields may extend out into the inter-electrode space by as much as ±250 μm, or more (such as in the direction of axis 951a), and may therefore be nearly equivalent to the 500 μm plate length. An additional 2× factor increase in the electric field which result, possibly due to the fact that the second deflector in the double deflection system (which bends the deflected beam back toward the axis) is split between the second and third deflector in the three-deflector system, so that there may effectively be a 2× magnification of the angle. A smaller inner diameter hole in the deflector may further amplify the electric field. A further contribution may also be that these deflectors are not isolated from the focusing electrodes and the combination of deflection and acceleration/deceleration fields may act as a deflection amplifier in some cases. Thus, some aspects of the present disclosure may permit employing lower voltage levels to achieve equivalent or higher angles of deflection that have previously been achieved only with higher voltage levels.

Consequently, a deflector component within the scope of the present disclosure may include a collection, sub-assembly, or assembly of deflector components. Such a collection of deflector components may include one or more sub-assembly components, such as the octupole component 400 shown in FIG. 4, and may additionally or alternatively include one or more substantially planar deflector components, such as the beam modification component 300 shown in FIG. 3. Each of the deflector components may also be substantially similar, or may be instances of the same component. For example, each of the deflector components may be substantially similar in thickness, footprint, profile, circuitry, composition, etc.

In some embodiments, employing multiple deflector components that are substantially planar without any deflector sub-assembly components may reduce the complexity of manufacture, assembly, and/or use of the resulting microcolumn. For example, while the amount of deflection that may be attained with a single instance of the octupole component 400 shown in FIG. 4 may be greater than the deflection that may be attained with a single instance of the substantially planar beam modification component 300 shown in FIG. 3, the assembly of multiple instances of the beam modification component 300 to an assembly substrate may be less complex than the process of constructing the sub-assembly of a single octupole component and subsequently assembling the octupole component to the assembly substrate. Thus, some microcolumn embodiments according to aspects of the present disclosure may specifically exclude any beam modification components that are not substantially planar, or may specifically exclude any beam modification components that are individual sub-assemblies. For example, some microcolumn embodiments according to aspects of the present disclosure, such as the microcolumn 950 shown in FIG. 10, may only include beam modification components that are each a single, discrete, integrally formed component.

This concept of employing multiple beam modification components each driven by lower signal levels in contrast to a single beam modification component driven by a higher signal level may also be applicable or readily adaptable to adjusting the focus, spot size, or speed of the beam, in contrast to the beam steering described above. For example, three beam focusing components each biased at about 1 kV may be employed instead of a single beam focusing component biased at about 3 kV. Thus, a focusing component within the scope of the present disclosure may include a collection, sub-assembly, or assembly of focusing components. Such a collection of focusing components may include one or more sub-assembly focusing components and/or one or more substantially planar focusing components. In one embodiment, such a collection of focusing components may exclude sub-assembly components.

Similarly, multiple accelerator/decelerator components each biased at a particular voltage (e.g., 1 kV) may be employed instead of a single accelerator/decelerator component biased at a higher voltage (e.g., 3 kV, in this example). Thus, an accelerator/decelerator component within the scope of the present disclosure may include a collection, sub-assembly, or assembly of accelerator/decelerator components. Such a collection of accelerator/decelerator components may include one or more sub-assembly accelerator/decelerator components and/or one or more substantially planar accelerator/decelerator components. In one embodiment, such a collection of accelerator/decelerator components may exclude sub-assembly components.

In some embodiments, the deflection components and/or other beam modification components may introduce undesired fringe effects or other aberrations to the electron beam. However, such effects may be prevented, reduced, and/or eliminated by employing an anode component or other type of grounded or otherwise biased component following each potentially problematic beam modification component. For example, in the embodiment shown in FIG. 10, the anode component 955 interposes neighboring deflector components 962, 963, and anode component 956 interposes neighboring deflector components 963, 964. The anode components 955, 956 may be grounded, although they may also be biased at other potentials in some embodiments, and may not all be biased at the same potential.

The beam modification components in some embodiments within the scope of the present disclosure may be positioned at a constant pitch. That is, the beam modification components may be equally spaced from each other, or may be oriented at equidistant intervals relative to each other. Such symmetry or periodicity of the beam modification components may decrease the complexity of assembly and design. In one embodiment, the beam modification components may be positioned at a substantially constant pitch of about 500 $\mu$m, although other embodiments may employ other intervals, including those that are not periodic.

In the embodiment shown in FIG. 10, the extractor component 952, the anode component 954, and the focusing electrode component 960 may be employed to modify the beam 951 to establish it at the desired spot size and align it with the central axis 951A. The remaining beam modification components 955–958, 962–964, 966 may be employed to steer the beam 951 within the field of view. The regular spacing of the beam modification components may be specific to a group of components, such as the beam modification components employed to establish or focus the beam 951, or the beam modification components employed for beam steering. For example, each of the beam modification components 952, 954, 960 may be equally spaced at a first pitch, and each of the beam modification components 955–958, 962–964, 966 may be equally spaced at a second pitch, wherein the first and second pitch may or may not be similar or the same.

The beam modification components, or a particular group of the beam modification components (e.g., the beam steering components), may also have substantially equal aperture diameters. For example, each of the components 955–958, 962–964, 966 are depicted in FIG. 10 as having substantially equal aperture diameters. In one embodiment, the aperture diameters may be about 50 $\mu$m, although other diameters may also be employed within the scope of the present disclosure.

Thus, the present disclosure introduces a microcolumn including, in one embodiment, a plurality of beam modification components coupled to an assembly substrate, wherein the plurality of beam modification components includes: (1) an extractor component; (2) a focusing electrode component; (3) a first anode component; (4) a first deflector component; (5) a second anode component; (6) a second deflector component; (7) a third anode component; (8) a third deflector component; (9) a fourth anode component; (10) an accelerator/decelerator component; and (11) a fifth anode component. In one embodiment, the beam modification components are arranged on the substrate in this order, although other sequences are also within the scope of the present disclosure.

The present disclosure also provides an apparatus including a first beam deflector configured to deflect a beam by a first angle and including a first number of substantially planar first components each independently able to deflect the beam by a second angle at a first maximum operating voltage, wherein the first number of substantially planar first components is not less than about a first quotient of the first and second angles. The apparatus also includes a second beam deflector configured to deflect the beam by a third angle and including a second number of substantially planar second components each independently able to deflect the beam by a fourth angle at a second maximum operating voltage, wherein the second number of substantially planar second components is not less than about a second quotient of the third and fourth angles. The first and second components may each be coupled to a substrate, wherein the first and second components are each substantially perpendicular relative to the substrate.

A method is also introduced in the present disclosure. The method includes coupling a first number of first beam deflector components to a substrate, wherein the first number is not less than a first quotient of a first desired beam deflection angle and a first maximum beam deflection angle of each first beam deflector component at a first maximum operating voltage. The method also includes coupling a second number of second beam deflector components to the substrate, wherein the second number is not less than a second quotient of a second desired beam deflection angle and a second maximum beam deflection angle of each second beam deflector component at a second maximum operating voltage. The second desired beam deflection angle maybe greater than the first desired beam deflection angle.

The foregoing has outlined features of several embodiments so that those skilled in the art may better understand the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A microcolumn, comprising:
a plurality of beam modification components coupled to an assembly substrate, the plurality of beam modification components including:
an extractor component;
a first focusing electrode component;
a first anode component;
a first deflector component;
a second focusing electrode component;
a second deflector component;
a third focusing electrode component;
a third deflector component;
a second anode component;
a fourth focusing electrode component; and
a third anode component.

2. The microcolumn of claim 1 wherein:
the first focusing electrode component and the fourth focusing electrode component interpose the extractor component and the third anode component;
the first anode component and the second anode component interpose the first focusing electrode component and the fourth focusing electrode component;
the first deflector component and the third deflector component interpose the first anode component and the fourth anode component;
the second focusing electrode component and the third focusing electrode component interpose the first deflector component and the third deflector component; and
the second deflector component interposes the second focusing electrode component and the third focusing electrode component.

3. The microcolumn of claim 1 wherein the assembly substrate includes a plurality of sockets, and wherein each of the plurality of beam modification components has a connector coupled to a corresponding one of the plurality of sockets.

4. The microcolumn of claim 1 wherein the plurality of beam modification components each have substantially the same thickness.

5. The microcolumn of claim 1 wherein each of the plurality of beam modification components is an integrally formed, substantially planar component.

6. The microcolumn of claim 1 wherein the first, second, and third deflector components are substantially similar.

7. The microcolumn of claim 1 wherein the first, second, and third deflector components each comprise a substantially planar component having a conductive layer divided into a plurality of electrodes collectively surrounding an aperture.

8. The microcolumn of claim 7 wherein the plurality of electrodes includes eight electrodes.

9. The microcolumn of claim 1 wherein the first, second, and third deflector components have substantially similar operating voltage levels.

10. The microcolumn of claim 1 wherein the maximum operating voltage of each of the first, second, and third deflector components is about 25 V.

11. The microcolumn of claim 1 wherein the maximum operating voltage of each of the plurality of beam modification components is about 1 kV.

12. The microcolumn of claim 1 wherein the first and second anode components, the first, second, and third deflector components, and the second and third focusing electrode components are each arranged on the assembly substrate at a substantially constant pitch.

13. The microcolumn of claim 12 wherein the substantially constant pitch is about 500 $\mu$m.

14. The microcolumn of claim 1 wherein the first and second anode components, the first, second, and third deflector components, and the second and third focusing electrode components each have an aperture, wherein such apertures are substantially similar in diameter.

* * * * *